United States Patent
Wu et al.

(10) Patent No.: US 10,965,297 B1
(45) Date of Patent: Mar. 30, 2021

(54) SIGMA-DELTA MODULATION QUANTIZATION ERROR REDUCTION TECHNIQUE FOR FRACTIONAL-N PHASE-LOCKED LOOP (PLL)

(71) Applicant: Samsung Electronics Co., Ltd., Gyeonggi-do (KR)

(72) Inventors: Wanghua Wu, Santa Clara, CA (US); Chih-Wei Yao, Saratoga, CA (US)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/890,757

(22) Filed: Jun. 2, 2020

Related U.S. Application Data (60) Provisional application No. 62/984,427, filed on Mar. 3, 2020.

(51) Int. Cl.
  *H03L 7/197* (2006.01)
  *H03L 7/099* (2006.01)
  *H03L 7/089* (2006.01)

(52) U.S. Cl.
  CPC .......... *H03L 7/1976* (2013.01); *H03L 7/0891* (2013.01); *H03L 7/099* (2013.01)

(58) Field of Classification Search
  CPC ..... H03L 7/1976; H03L 7/0891; H03L 7/099; H03L 7/08; H03L 7/16; H03L 7/18
  USPC ................................................ 327/144–159
  See application file for complete search history.

(56) References Cited

U.S. PATENT DOCUMENTS

| | | | | |
|---|---|---|---|---|
| 8,497,716 | B2* | 7/2013 | Zhang | H03L 7/1976 |
| | | | | 327/156 |
| 10,581,418 | B2* | 3/2020 | Wu | H03L 7/0805 |
| 2002/0145472 | A1 | 10/2002 | Oh | |
| 2010/0164562 | A1* | 7/2010 | Tseng | G06F 1/08 |
| | | | | 327/118 |
| 2011/0234269 | A1* | 9/2011 | Yu | H03L 7/0898 |
| | | | | 327/155 |
| 2012/0200328 | A1* | 8/2012 | Yao | H03L 7/06 |
| | | | | 327/157 |
| 2014/0354335 | A1 | 12/2014 | Syllaios et al. | |
| 2015/0145571 | A1* | 5/2015 | Perrott | H03L 7/093 |
| | | | | 327/159 |
| 2015/0200677 | A1 | 7/2015 | Ainspan et al. | |
| 2017/0179969 | A1 | 6/2017 | Meng et al. | |
| 2017/0366376 | A1* | 12/2017 | Wang | H04L 27/0014 |
| 2020/0348626 | A1* | 11/2020 | Yao | H03M 1/48 |

* cited by examiner

*Primary Examiner* — Tomi Skibinski
(74) *Attorney, Agent, or Firm* — The Farrell Law Firm, P.C.

(57) ABSTRACT

Methods and apparatuses are provided for fractional-N frequency synthesis using a phase-locked loop (PLL). A phase detector (PD) of the PLL determines a phase difference between a clock and a feedback clock (CLKFB). A low-pass loop filter of the PLL detects a control voltage based on the phase difference. A voltage-controlled oscillator (VCO) of the PLL generates a periodic signal based on the control voltage. A sigma-delta modulator (SDM) of the PLL generates a division sequence ratio and a selection control signal based on a frequency command word. A multi-modulus divider (MMDIV) generates a first CLKFB and a second CLKFB based on the division sequence ratio and differential inputs of the periodic signal. The MMDIV outputs one of the first CLKFB and the second CLKFB as the CLKFB to the PD based on the selection control signal.

22 Claims, 10 Drawing Sheets

SIGMA-DELTA MODULATION QUANTIZATION ERROR REDUCTION TECHNIQUE FOR FRACTIONAL-N PHASE-LOCKED LOOP (PLL)

PRIORITY

This application is based on and claims priority under 35 U.S.C. § 119(e) to a U.S. Provisional Patent Application filed on Mar. 3, 2020 in the United States Patent and Trademark Office and assigned Ser. No. 62/984,427 the contents of which are incorporated herein by reference.

FIELD

The present disclosure relates generally to phase-locked loops (PLLs), and more particularly, to a method and system for quantization error (QE) reduction for a fractional-N PLL.

BACKGROUND

Figure 1:
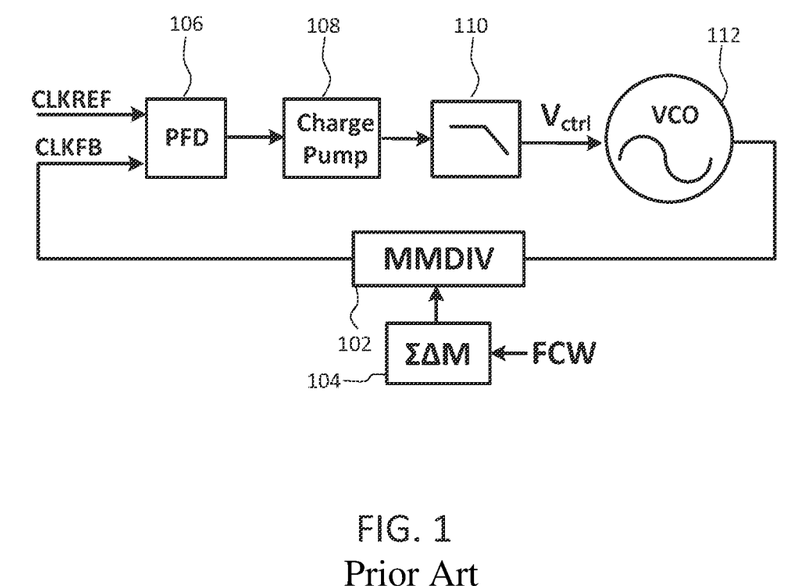
FIG. 1 is a diagram illustrating a fractional-N PLL.

A sigma-delta modulator (SDM or $\Sigma\Delta M$) is commonly used to control a multi-modulus divider (MMDIV) in a PLL for fractional-N frequency synthesis. Referring initially to FIG. 1, a diagram illustrates a fractional-N PLL. An MMDIV 102 driven by an SDM 104 is used in a feedback path for fractional-N frequency synthesis. The SDM 104 receives a frequency command word (FCW) and outputs a division ratio sequence (NDIV) to the drive the MMDIV 102. An output clock of the MMDIV 102, which is also referred to as a feedback clock (CLKFB) is fed to a phase detector (PD), which is embodied as a phase frequency detector (PFD) 106 and a charge pump 108. The PFD 106 receives the CLKFB along with a reference clock (CLKREF). The PFD 106 provides a signal proportional to a phase difference between the received clock signals, and the charge pump 108 is used to sink and source current to a low-pass loop filter 110 based on the output from the PFD 106. The low-pass loop filter 110 filters the received signal and outputs a control voltage $V_{ctrk}$ that controls a frequency of a voltage-controlled oscillator (VCO) 112, which outputs a periodic signal CLKVCO to the MMDIV 102.

The SDM 104 introduces a QE in the CLKFB of the MMDIV 102. This QE degrades PLL performance in several aspects. First, the QE contributes to PLL in-band phase noise (PN). Secondly, the QE increases the required linear operation range of the PD after locking, making PD design difficult.

Various techniques have been proposed to reduce the QE. One such technique employs a high performance PD capable of handling a large QE. The PD can be embodied as the PFD 106 and the charge pump 108 in an analog PLL, or as a time-to-digital converter (TDC) in a digital PLL. The charge pump 108 and the TDC are challenging sub-blocks in a fractional-N PLL.

Figure 2:
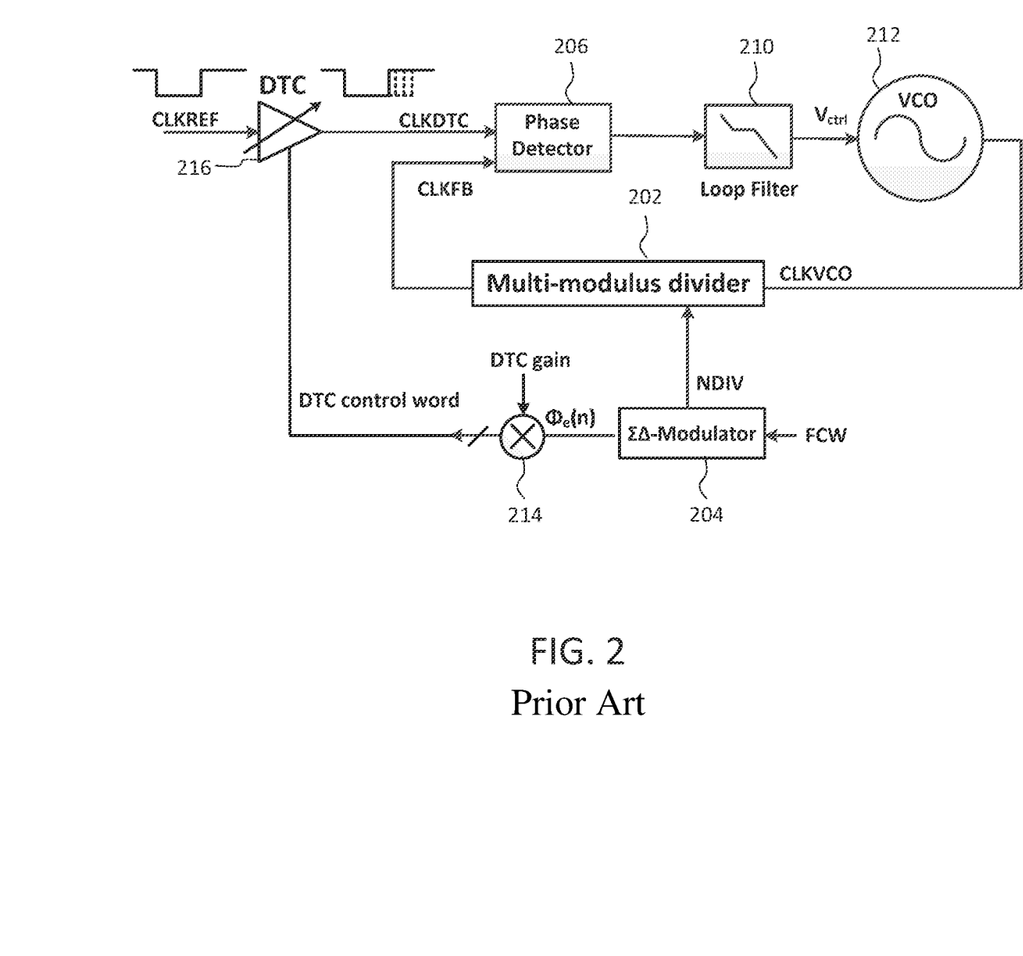
FIG. 2 is a diagram illustrating a fractional-N PLL using a DTC to compensate for QE.

Another technique for reducing the QE, adds a digital-to-time converter (DTC) in the CLKREF path in order to cancel out the QE in the CLKFB. FIG. 2 is a diagram illustrating a fractional-N PLL using a DTC to compensate for QE. The PLL of FIG. 2 includes an MMDIV 202, an SDM 204, a PD 206, a low-pass loop filter 210, and a VCO 212, which operate in a manner similar that which is described with respect to FIG. 1. The SDM 204 provides the QE (or <E(n)) to a multiplier 214 to be combined with DTC gain. A DTC control word is output from the multiplier 214 and provided to a DTC 216, which uses the DTC control word to adjust the CLKREF to CLKDTC. The CLKDTC is fed to the PD 206 with the CLKFB from the MMDIV 202, such that the QE may be canceled out from the CLKFB.

This technique attempts to prevent the PD from seeing the QE. The DTC range is required to be sufficient to cover the entire range of the QE. For a given order of SDM, the QE in the CLKFB is proportional to a MMDIV input clock period, which is a VCO period in a given PLL ($T_{VCO}$). The QE also increases rapidly with the order of SDM. For a 1st order SDM, the QE is within 1 $T_{VCO}$. For a 2nd order SDM, the QE doubles to $2*T_{VCO}$, and for a 3rd order SDM, the QE becomes $4*T_{VCO}$. Generally, a $2^{nd}$ or $3^{rd}$ order SDM is required in a fractional-N PLL to randomize the sequence, which results in lower fractional spurs to meet the requirement for communication systems.

Thus, a QE canceller circuit, such as, for example, the DTC 216, needs to cover a delay range larger than $4*T_{VCO}$ for a $3^{rd}$ order SDM. For example, if the VCO frequency is 4 GHz, the required DTC range is 1 nanosecond (ns). It is challenging to design a DTC with a larger delay range (DR) while achieving low integral nonlinearity (INL), which is critical for lower fractional spur levels. Moreover, DTC thermal noise increases proportionally to the square of the delay, which contributes additional in-band PN in a PLL.

SUMMARY

According to one embodiment, a PLL for fractional-N frequency synthesis is provided. The PLL includes a PD configured to receive a clock and a CLKFB, and to generate and output a resulting phase difference between the clock and the CLKFB. The PLL also includes a low-pass loop filter configured to receive the resulting phase difference, and to generate and output a control voltage. The PLL additionally includes a VCO configured to receive the control voltage, and to generate and output a periodic signal based on the voltage, and an SDM configured to receive a frequency command word, and to generate and output a division sequence ratio and a selection control signal. The PLL further includes an MMDIV configured to receive differential inputs of the periodic signal from the VCO, and to receive the division sequence ratio and the selection control signal from the SDM. The MMDIV is configured to generate a first CLKFB and a second CLKFB based on the differential inputs and the division sequence ratio, and to output one of the first CLKFB and the second CLKFB as the CLKFB to the PD based on the selection control signal.

According to one embodiment, a method is provided for fractional-N frequency synthesis using a PLL. A PD of the PLL determines a phase difference between a clock and a CLKFB. A low-pass loop filter of the PLL detects a control voltage based on the phase difference. A VCO of the PLL generates a periodic signal based on the control voltage. An SDM of the PLL generates a division sequence ratio and a selection control signal based on a frequency command word. An MMDIV generates a first CLKFB and a second CLKFB based on the division sequence ratio and differential inputs of the periodic signal. The MMDIV outputs one of the first CLKFB and the second CLKFB as the CLKFB to the PD based on the selection control signal.

According to one embodiment, an MMDIV of a PLL for fractional-N frequency synthesis is provided. The MMDIV includes a divider configured to receive differential inputs of a periodic signal from a VCO of the PLL, to receive a division sequence ratio from a sigma-delta modulator (SDM) of the PLL, and to generate and output a clock signal. The MMDIV also includes a first flip-flop configured to receive the clock signal and a first differential input of the periodic signal, and to generate and output a first CLKFB. The MMDIV additionally includes a second flip-flop configured to receive the clock signal and a second differential input of the periodic signal, and to generate and output a second CLKFB. The MMDIV further includes a multiplexer configured to receive the first CLKFB, the second CLKFB, and a selection control signal from the SDM, and to output one of the first CLKFB and the second CLKFB as a CLKFB to a PD of the PLL, based on the selection control signal.

BRIEF DESCRIPTION OF THE DRAWINGS

The above and other aspects, features, and advantages of certain embodiments of the present disclosure will be more apparent from the following detailed description, when taken in conjunction with the accompanying drawings, in which.

DETAILED DESCRIPTION

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate the existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The electronic device according to one embodiment may be one of various types of electronic devices. The electronic devices may include, for example, a portable communication device (e.g., a smart phone), a computer, a portable multimedia device, a portable medical device, a camera, a wearable device, or a home appliance. According to one embodiment of the disclosure, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "1$^{st}$," "2nd," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wired), wirelessly, or via a third element.

As used herein, the term "module" may include a unit implemented in hardware, software, or firmware, and may interchangeably be used with other terms, such as, for example, "logic," "logic block," "part," and "circuitry." A module may be a single integral component, or a minimum unit or part thereof, adapted to perform one or more functions. For example, according to one embodiment, a module may be implemented in a form of an application-specific integrated circuit (ASIC).

The present system and method provide a technique to reduce QE by half for any given order of SDM. Thus, the required linear operation range of the PD (i.e., a TDC, or a PFD and charge-pump) can be halved. This leads to lower noise, less power consumption, and low fractional spurs.

In a DTC-based PLL, in which the DTC is used to cancel the QE before the PD, the system and method can also help to reduce the required DTC range by half. This leads to less DTC thermal noise, better linearity, and lower power consumption for DTC design.

Digital logic is added before and after the SDM to generate a new NDIV for the MMDIV, a clock selection control signal for the MMDIV, and a halved QE for QE cancellation used in a DTC or other canceller circuits.

Changes in the digital domain of the PLL can be synthesized, placed, and routed via digital flow with negligible effect on area and power. The analog domain requires the addition of two digital flip-flops to retime the MMDIV output clock by CLKVCO (VCO_P) and the inversed version of CLKVCO (VCO_N), respectively, and thus, use a multiplexer to select between the two. The selection control signal is generated from the modified SDM.

As the QE is reduced by half, the required DTC range is halved. Simulated DTC PN is 4 dB lower and INL is also reduced to half of the original INL. The system and method can also be applied to other fractional-N PLL topologies to improve PD performance and reduce the QE's impact to PLL PN.

Figure 3A:
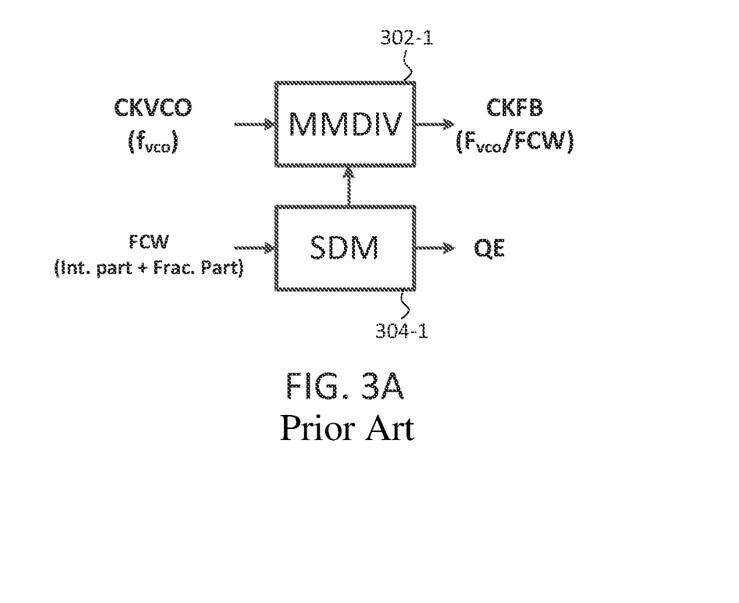
FIG. 3A is a diagram illustrating a conventional MMDIV and SDM of a fractional-N PLL.

Referring to FIG. 3A, a diagram illustrates a conventional MMDIV and SDM of a fractional-N PLL. An SDM 304-1 receives the FCW and outputs the QE and the NDIV. The NDIV is provided to an MMDIV 302-1 along with CKVCO (having a frequency of $f_{VCO}$) from a VCO, and outputs CLKFB ($F_{VCO}$/FCW).

Figure 3B:
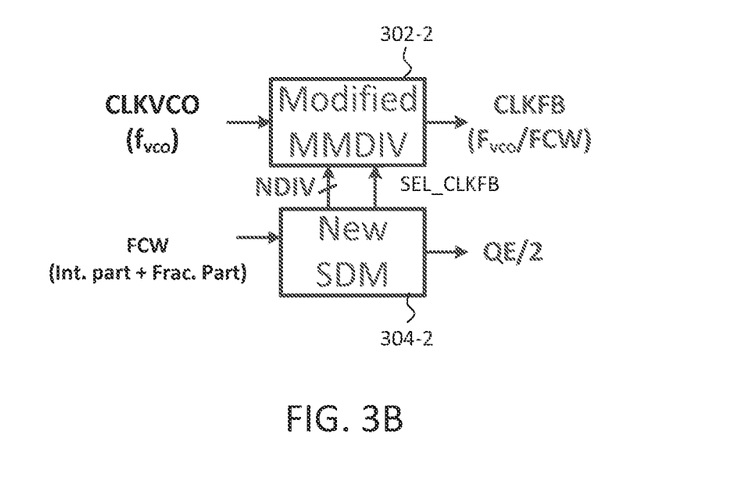
FIG. 3B is a diagram illustrating an MMDIV and an SDM of a fractional-N PLL, according to an embodiment of the disclosure.

FIG. 3B is a diagram illustrating MMDIV and SDM of a fractional-N PLL, according to an embodiment of the disclosure. An SDM 304-2 receives the FCW and outputs QE/2. Additionally, the SDM 304-2 provides NDIV and SEL_CLKFB to an MMDIV 302-2. The SEL_CLKFB is used to select between CLKFBs generated in the MMDIV 302-2, as described in greater detail below with respect to FIG. 4A.

With the changes described in FIG. 3B, the MMDIV can support an NDIV of (N+0.5). Thus, the QE introduced in CLKFB due to fractional-N division is reduced by half compared to the conventional embodiment of FIG. 3A.

Figure 4A:
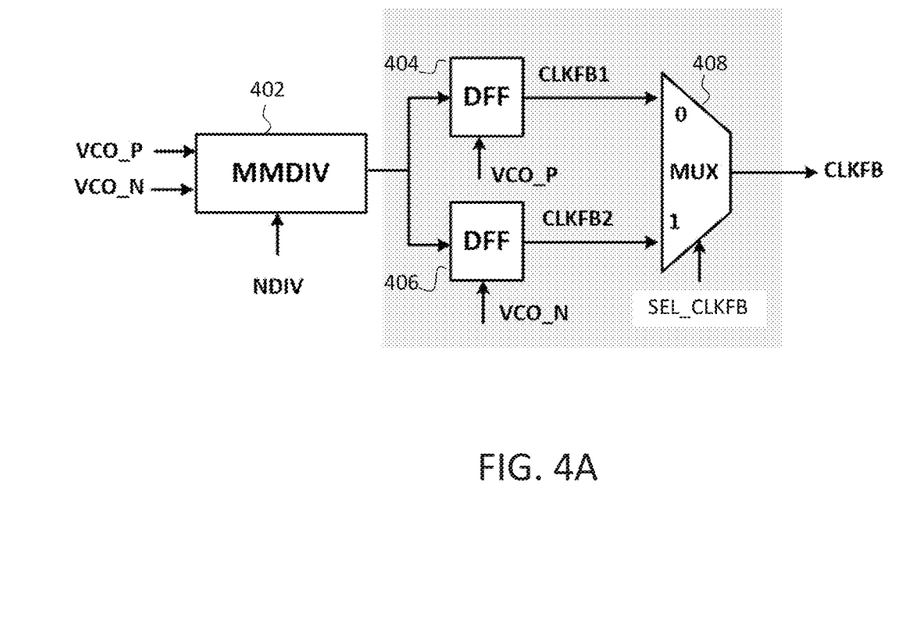
FIGS. 4A and 4B are diagrams illustrating a retimed MMDIV output clock of a fractional-N PLL, according to an embodiment of the disclosure.
Figure 4B:
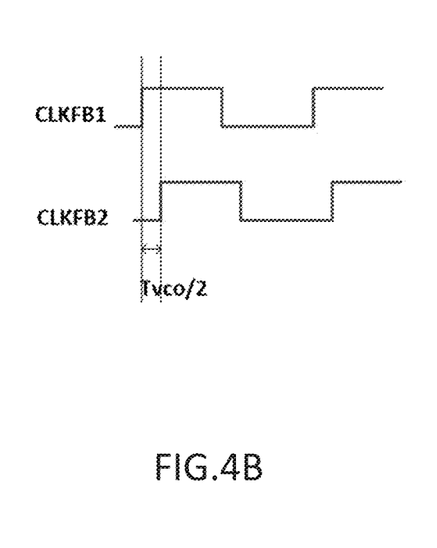

Referring now FIGS. 4A and 4B, diagrams illustrate a retimed MMDIV output clock of a fractional-N PLL, according to an embodiment of the disclosure. An MMDIV 402 receives differential input clocks VCO_P and VCO_N from the VCO, and receives NDIV from the SDM. The MMDIV 402 outputs CLKFB_int to a first delay flip-flop (DFF) 404 and a second DFF 406. Conventionally, CLKFB_int is the CLKFB that is provided to the PD and includes QE.

The first DFF 404 also receives VCO_P, and then outputs a first feedback clock CLKFB1. The second DFF 406 also receives VCO_N, and then outputs a second feedback clock CLKFB2. A multiplexer (MUX) 408 receives CLKFB1 from the first DFF 404, CLKFB2 from the second DFF 406, and SEL_CLKFB from the SDM. In accordance with the SEL_CLKFB, the MUX 408 selects one of the CLKFB1 and the CLKFB2 as output CLKFB. IF the QE in CLKFB_int is greater than $T_{VCO}/2$, CLKFB2 is selected because it is delayed by $T_{VCO}/2$ compared to CLKFB1. Accordingly, the QE in CLKFB is reduced to $T_{VCO}/2$, which is equivalent to dividing by (N+0.5).

FIG. 4B illustrates that a rising edge of CLKFB2 is delayed by $T_{VCO}/2$ compared to the rising edge of CLKFB1, due to the differential input clocks VCO_P and VCO_N.

Figure 5:
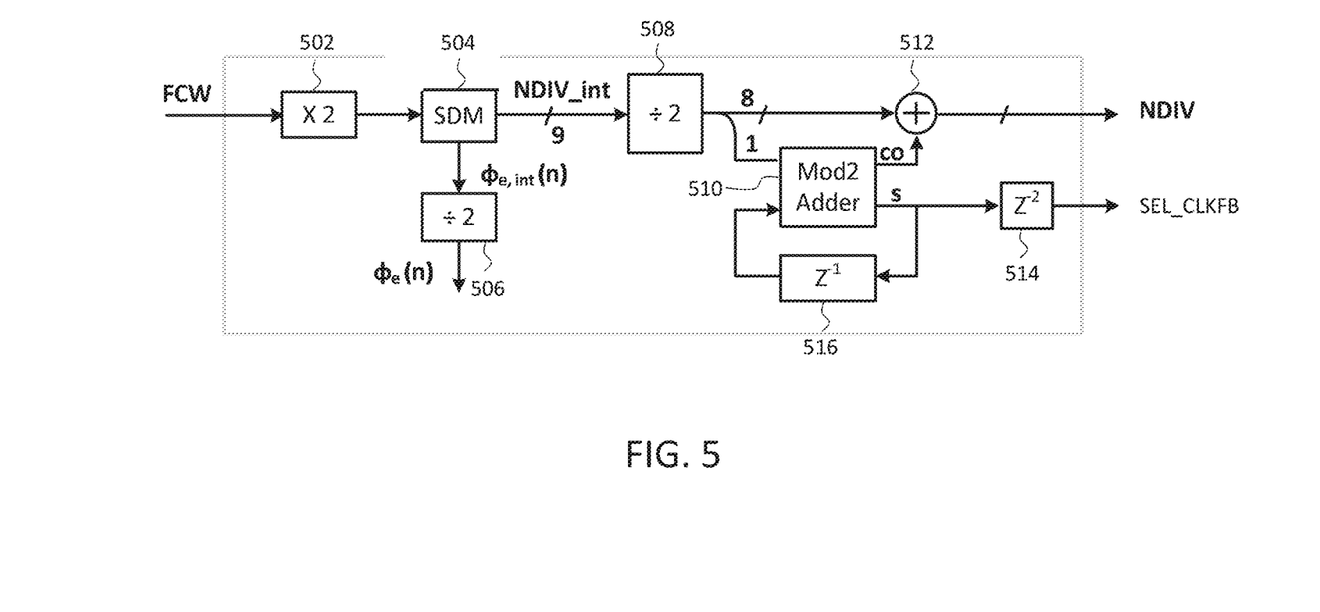
FIG. 5 is a diagram illustrating an SDM of a fractional-N PLL, according to an embodiment of the disclosure.

FIG. 5 is a diagram illustrating an SDM of a fractional-N PLL, according to an embodiment of the disclosure. The FCW is received and multiplied by 2 (left shift) at a multiplier 502. Output from the multiplier 502 is split into the integer part of FCW and fractional part of FCW and provided to a conventional SDM 504, which outputs an integer part of QE (QE_int(n) or $\phi_{e,int}(n)$) and an integer part of NDIV (NDIV_int). In order to achieve the correct division ratio, both the QE_int(n) and the NDIV_int must be divided by 2 (right shift). The QE_int(n) is divided by 2 at a first divider 506, resulting in QE(n) (or #e(n)). The NDIV_int is divided by 2 (right shift) at a second divider 508. Dividing NDIV_int, results in one fractional bit (0 or 0.5), which is sent to a modulo-2 adder (mod 2 adder) 510. The mod 2 adder 510 outputs a carry out bit that is added to the integer part of NDIV_int/2 at adder 512, resulting in NDIV. This resulting NDIV is provided to the MMDIV. Accordingly, the average NDIV is equal to that achieved by the conventional approach.

The mod 2 adder 510 also outputs a sum s to a delay block $Z^{-2}$ 514, which implements a delay of two clock cycles, and provides the resulting SEL_CLKFB to the MMDIV. A delay block $Z^{-1}$ 516 also receives sum s, implements a delay of one clock cycle, and provides the resulting output back to the mod 2 adder 510.

Figure 6:
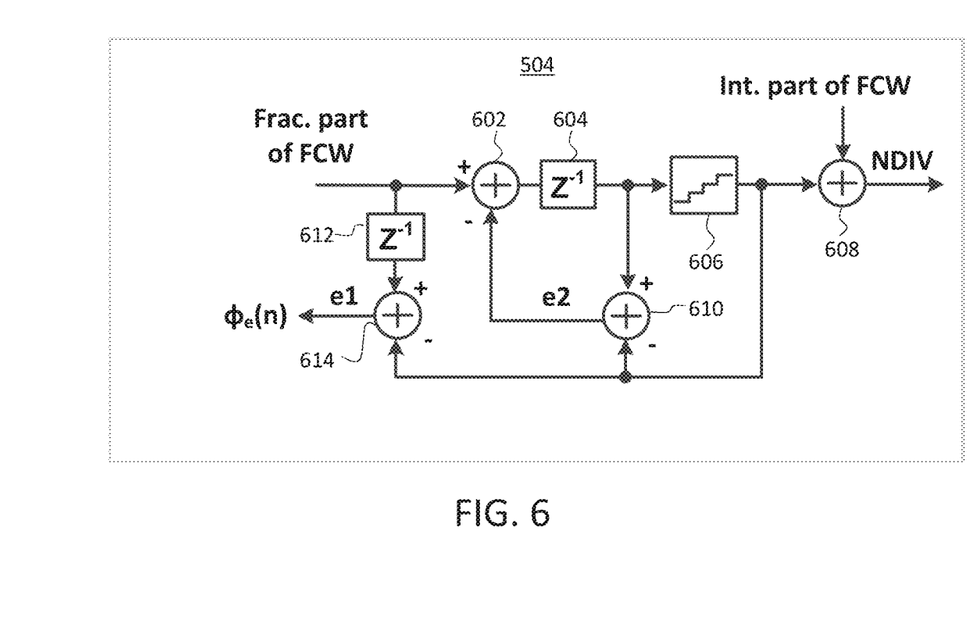
FIG. 6 is a diagram illustrates an SDM of a fractional-N PLL, according to an embodiment of the disclosure.

Referring now to FIG. 6, a diagram illustrates an SDM of a fractional-N PLL, according to an embodiment. Specifically, the SDM of FIG. 6 corresponds to the SDM 504 of FIG. 5. The fractional part of FCW is provided to a first adder 602, and output from the first adder 602 is provided to a first delay block $Z^{-1}$ 604, which implements a delay of one clock cycle. The delayed output from the first delay block $Z^{-1}$ 604 is provided to a quantizer 606, and the quantized output is provided to a second adder 608 along with the integer part of FCW. The output of the second adder 608 is the integer part of NDIV (or NDIV_int).

The quantized output from quantizer 606 is also provided to a third adder 610 along with the delayed output from the first delay block $Z^{-1}$ 604. An output e2 from the third adder 610 is provided to the first adder 602 along with fractional part of FCW.

The fractional part of FCW is also provided to a second delay block $Z^{-1}$ 612, which implements a delay of one clock cycle. The delay output from the second delay block $Z^{-1}$ 612 is provided to a fourth adder 614 along with the quantized output from the quantizer 606. Output e1 from the fourth adder 614 is the integer part of QE(n) (QE_int(n) or e,int(n)).

In order to robustly enable the system and method when a VCO clock is not an ideal 50% duty cycle (e.g., with analog circuit imperfection), an LMS-based background calibration loop is may be added to correct the duty cycle of the VCO clock.

Specifically, if VCO_P and VCO_N have duty cycle errors (i.e., they are not fully differential), CLKFB1 and CLKFB2 timing will not differ by exactly $T_{VCO}/2$, which introduces errors. These errors slow down DTC gain calibration, resulting in convergence at an incorrect value. Accordingly, a VCO duty cycle calibration (DCC) least-mean square (LMS) loop may be added by correlating phase error polarity with the SEL_CLKFB. Specifically, DTC gain converges quickly with no error, and calibration results are applied to the DTC to compensate for the errors. A simple and small extension may be added to the required DTC range since VCO duty cycle error is small.

Figure 7:
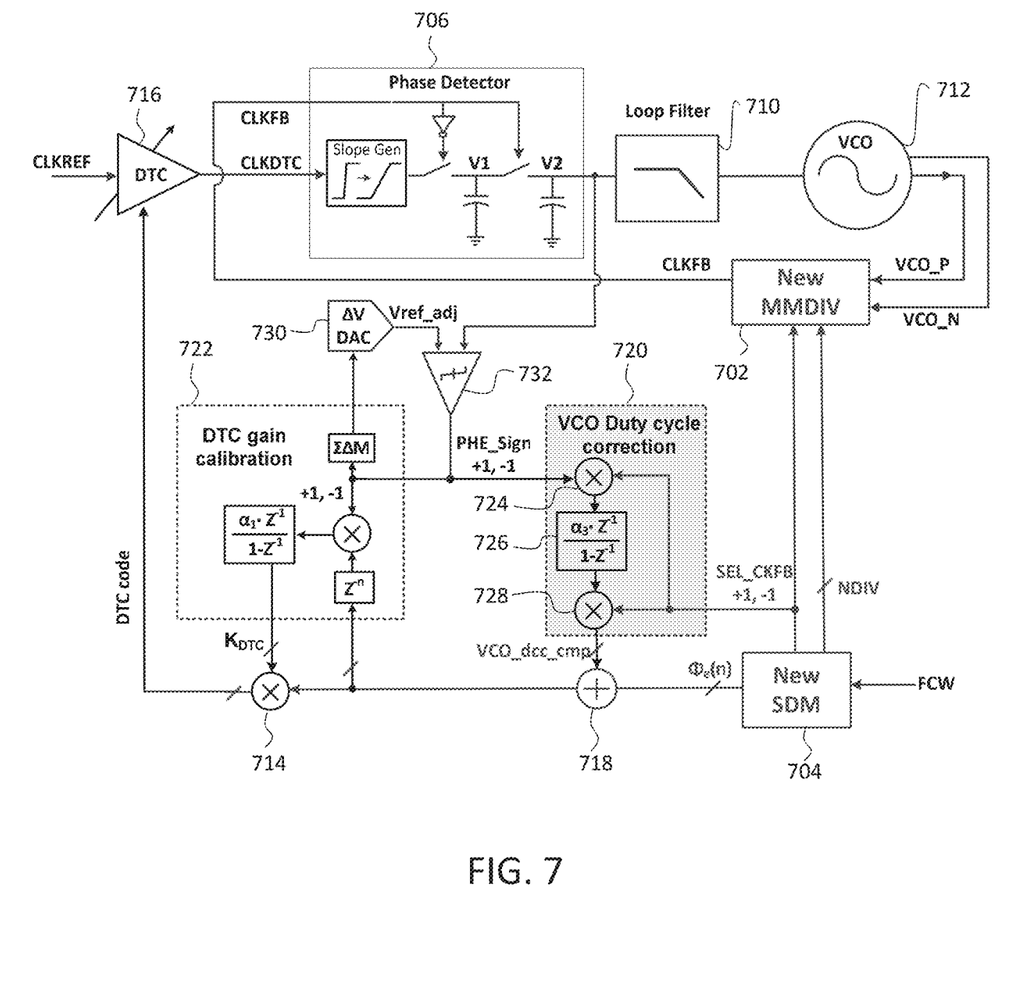
FIG. 7 is a diagram illustrating a fractional-N PLL using a DTC and VCO duty cycle correction, according to an embodiment of the disclosure.

Referring now to FIG. 7, a diagram illustrates a fractional-N PLL using a DTC and VCO duty cycle correction, according to an embodiment. Specifically, FIG. 7 provides a more detailed illustration of the PLL of FIG. 2 and incorporates the MMDIV of FIG. 4A and the SDM of FIG. 5. Additionally, FIG. 7 provides VCO duty cycle correction.

The PLL of FIG. 7 includes an MMDIV 702, an SDM 704, a PD 706, a low-pass loop filter 710, and a VCO 712. The MMDIV 702 operates as described above with respect to FIG. 4A, and the SDM 704 operates as described above with respect to FIGS. 5 and 6. The SDM 704 provides the QE(n) (or $\phi_e(n)$) to an adder 718, which also receives a converged value VCO_dec_cmp from a VCO duty cycle correction block 720. A result from the adder 718 is provided to a first multiplier 714 to be combined with DTC gain ($K_{DTC}$) from a DTC gain calibration block 722. A DTC control word is output from the first multiplier 714 and provided to a DTC 716, which uses the DTC control word to adjust the CLKREF to CLKDTC. The CLKDTC is fed to the PD 706 with the CLKFB from the MMDIV 702, such that the QE may be canceled out from the CLKFB.

PHE_Sign is sign information of a phase error between CLKDTC and CLKFB. If CLKDTC is leading CLKFB, PHE_Sign is +1. If CLKDTC is not leading CLKFB, PHE_Sign is −1.

VCO duty cycle error causes a phase shift in CLKFB edges and eventually becomes evident in the PHE_Sign. Thus, PHE_Sign has a strong correlation with SEL_CLKFB, since SEL_CLKFB is used to select CLKFB1 or CLKFB2 as the CLKFB. Accordingly, a sign-sign regression based least-mean-square (LMS) adaptation loop is added to extract VCO duty cycle error.

The VCO duty cycle correction block 720 receives SEL_CLKFB from the SDM 704 and the PHE_Sign at a second multiplier 724. Output from the second multiplier 724 is provided to an accumulator 726 having a gain factor. The accumulated output from the accumulator 726 is provided to a third multiplier 728, along with SEL_CLKFB from the SDM 704, to apply a correction. The output from the third multiplier 728 is the converged value VCO_dec_cmp, which is provided to the adder 718 with the QE(n) (or #e(n)) in order to control DTC delay.

The same phase shift on CLKFB due to VCO duty cycle error is applied to CLKDTC via DTC delay code, and thus, the phase detector will no longer detect this phase error. The proposed VCO duty cycle correction does not require additional analog circuits, and instead uses a PHE_Sign signal that preexists for DTC gain calibration.

The DTC gain calibration block 722 receives a result of the adder 718 as input, and provides output to a digital to analog converter (DAC) 730. A reference voltage Vref_adj output from the DAC 730 is provided to a voltage comparator 732 along with output from the PD 706. The voltage comparator 732 provides the PHE_Sign to the VCO duty cycle correction block 720. The DTC gain calibration block 722 includes components such as, for example, an SDM, a multiplier, a delay block, and an accumulator, and functions as known commonly in the art. Similarly, the PD 706 includes components such as, for example, a slope generator, and also functions as known commonly in the art.

Figure 8:
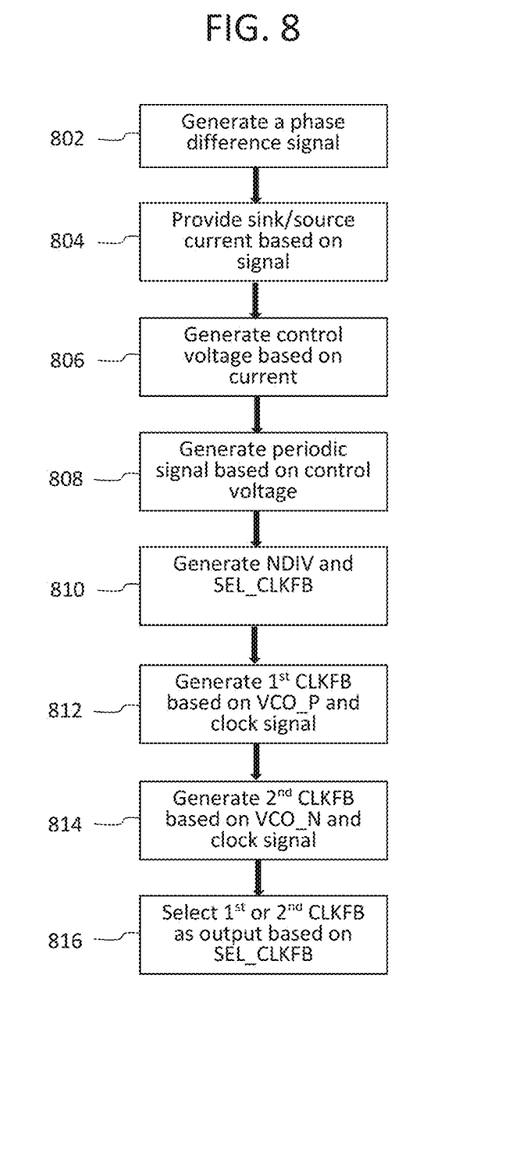
FIG. 8 is a flow chart illustrating a method for fractional-N frequency synthesis using PLL, according to an embodiment of the disclosure.

Referring to FIG. 8, a flow chart illustrates a method for fractional-N frequency synthesis using PLL, according to an embodiment of the disclosure. A PFD of the PLL generates a signal proportional to a phase difference between a clock and a CLKFB, at 802. A charge pump of the PLL provides a sink and source current based on the signal, at 804. A low-pass loop filter of the PLL generates a control voltage based on the sink and source current, at 806. A VCO of the PLL generates a periodic signal based on the control voltage, at 808. An SDM of the PLL generates a NDIV and a SEL_CLKFB, based on a frequency command word, at 810.

The NDIV is generated by doubling the frequency command word, performing sigma-delta modulation on the doubled frequency command word to generate a first NDIV, and halving the first NDIV to output a final NDIV.

An MMDIV of the PLL generates a first CLKFB based on a first differential input of the periodic signal (VCO_P) and a clock signal, which is generated using first and second differential inputs (VCO_P and VCO_N) and the NDIV, at 812. The MMDIV generates a second CLKFB based on a second differential input of the periodic signal (VCO_N) and the clock signal, at 814. The MMDIV selects one of the first CLKFB and the second CLKFB as the CLKFB output to the PFD based on the SEL_CLKFB, at 816.

Figure 9:
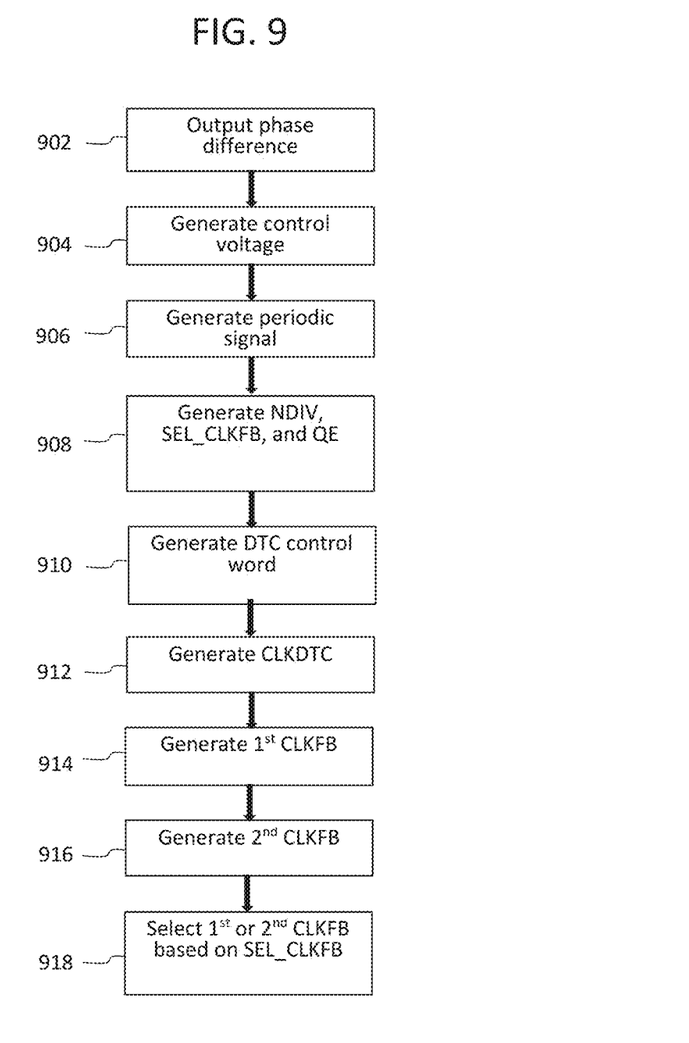
FIG. 9 is a flow chart illustrating a method for fractional-N frequency synthesis using a DTC PLL, according to an embodiment of the disclosure.

Referring to FIG. 9, a flow chart illustrates a method for fractional-N frequency synthesis using a DTC PLL, according to an embodiment of the disclosure. A PD receives a clock and a CLKFB and outputs a resulting phase difference between the clock and the CLKFB, at 902. A low-pass loop filter of the PLL generates a control voltage based on the phase difference, at 904. A VCO of the PLL generates a periodic signal based on the control voltage, at 906. An SDM of the PLL generates a NDIV, a SEL_CLKFB, and a QE, based on a frequency command word, at 908.

The NDIV and the QE are generated by doubling the frequency command word, performing sigma-delta modulation on the doubled frequency command word to generate a first NDIV and a first QE, halving the first NDIV to output a final NDIV, and halving the first QE to output a final QE.

The QE and a DTC gain are combined to generate a DTC control word, at 910. A DTC generates a CLKDTC as the clock input to the PD, based on a CLKREF and the DTC control word, at 912.

An MMDIV of the PLL generates a first CLKFB based on a first differential input of the periodic signal (VCO_P) and a clock signal, which is generated using first and second differential inputs (VCO_P and VCO_N) and the NDIV, at 914. The MMDIV generates a second CLKFB based on a second differential input of the periodic signal (VCO_N) and the clock signal, at 916. The MMDIV selects one of the first CLKFB and the second CLKFB as the CLKFB output to the PD based on the SEL_CLKFB, at 918.

The disclosed systems and methods can support a high order of SDM operations, support lower VCO oscillation frequency for a given DTC range, provide little analog circuit change or overhead, and the digital background calibration ensures robustness of the proposed system and method with the presence of VCO duty cycle errors.

The system and method may also be utilized in examples where a ¼ $T_{VCO}$ delay is handled using a quadrature VCO (QVCO) or ring oscillator.

Figure 10:
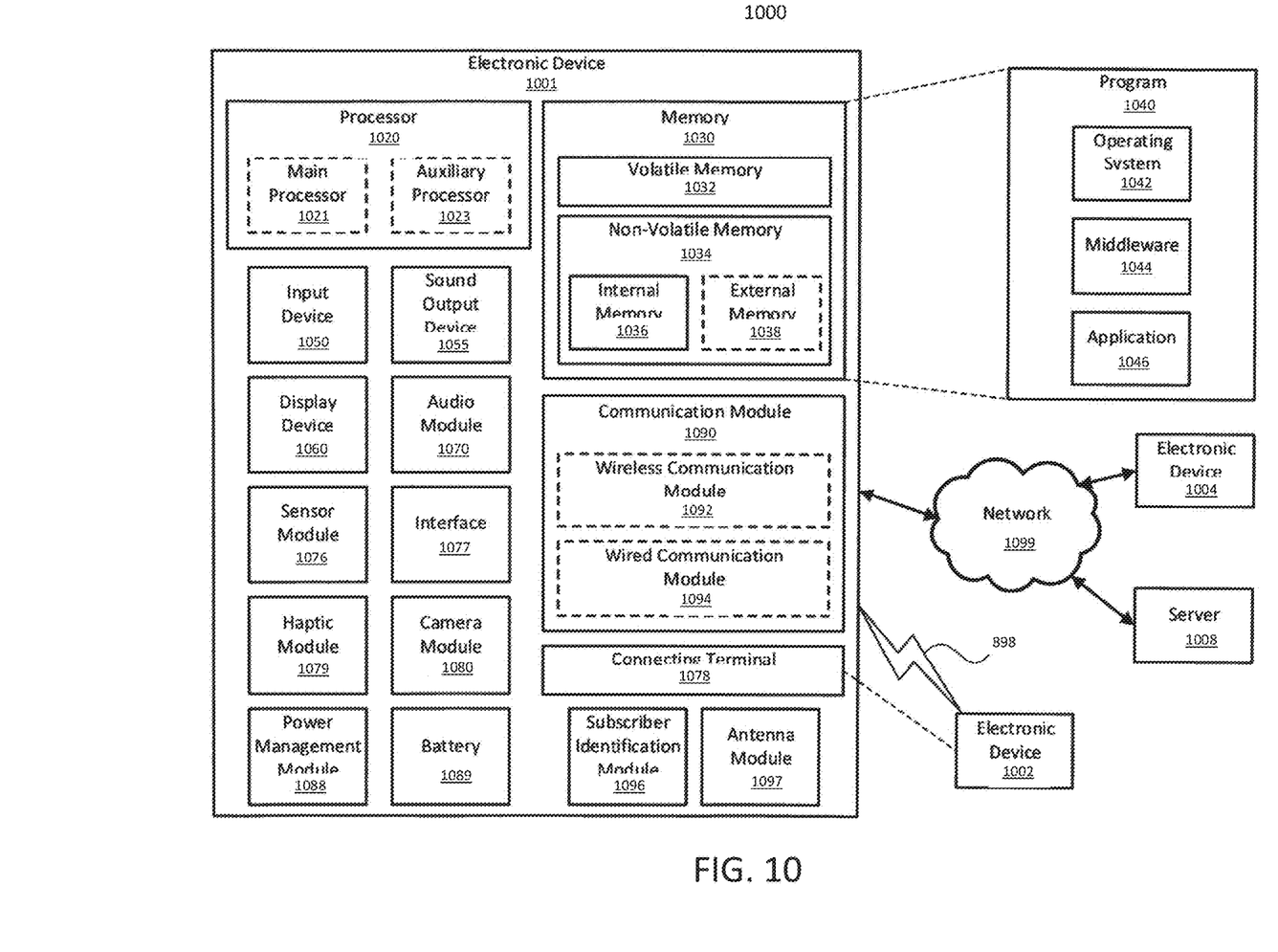
FIG. 10 is a block diagram of an electronic device in a network environment, according to an embodiment of the disclosure.

FIG. 10 is a block diagram of an electronic device in a network environment, according to one embodiment. Referring to FIG. 10, an electronic device 1001 in a network environment 1000 may communicate with an electronic device 1002 via a first network 898 (e.g., a short-range wireless communication network), or an electronic device 1004 or a server 1008 via a second network 1099 (e.g., a long-range wireless communication network). The electronic device 1001 may communicate with the electronic device 1004 via the server 1008. The electronic device 1001 may include a processor 1020, a memory 1030, an input device 1050, a sound output device 1055, a display device 1060, an audio module 1070, a sensor module 1076, an interface 1077, a haptic module 1079, a camera module 1080, a power management module 1088, a battery 1089, a communication module 1090, a subscriber identification module (SIM) 1096, or an antenna module 1097. In one embodiment, at least one (e.g., the display device 1060 or the camera module 1080) of the components may be omitted from the electronic device 1001, or one or more other components may be added to the electronic device 1001. Some of the components may be implemented as a single integrated circuit (IC). For example, the sensor module 1076 (e.g., a fingerprint sensor, an iris sensor, or an illuminance sensor) may be embedded in the display device 1060 (e.g., a display).

The processor 1020 may execute, for example, software (e.g., a program 1040) to control at least one other component (e.g., a hardware or a software component) of the electronic device 1001 coupled with the processor 1020, and may perform various data processing or computations. As at least part of the data processing or computations, the processor 1020 may load a command or data received from another component (e.g., the sensor module 1076 or the communication module 1090) in volatile memory 1032, process the command or the data stored in the volatile memory 1032, and store resulting data in non-volatile memory 1034. The processor 1020 may include a main processor 1021 (e.g., a central processing unit (CPU) or an application processor (AP)), and an auxiliary processor 1023 (e.g., a graphics processing unit (GPU), an image signal processor (ISP), a sensor hub processor, or a communication processor (CP)) that is operable independently from, or in conjunction with, the main processor 1021. Additionally or alternatively, the auxiliary processor 1023 may be adapted to consume less power than the main processor 1021, or execute a particular function. The auxiliary processor 1023 may be implemented as being separate from, or a part of, the main processor 1021.

The auxiliary processor 1023 may control at least some of the functions or states related to at least one component (e.g., the display device 1060, the sensor module 1076, or the communication module 1090) among the components of the electronic device 1001, instead of the main processor 1021 while the main processor 1021 is in an inactive (e.g., sleep) state, or together with the main processor 1021 while the main processor 1021 is in an active state (e.g., executing an application). The auxiliary processor 1023 (e.g., an image signal processor or a communication processor) may be implemented as part of another component (e.g., the camera module 1080 or the communication module 1090) functionally related to the auxiliary processor 1023.

The memory 1030 may store various data used by at least one component (e.g., the processor 1020 or the sensor module 1076) of the electronic device 1001. The various data may include, for example, software (e.g., the program 1040) and input data or output data for a command related thereto. The memory 1030 may include the volatile memory 1032 or the non-volatile memory 1034.

The program 1040 may be stored in the memory 1030 as software, and may include, for example, an operating system (OS) 1042, middleware 1044, or an application 1046.

The input device 1050 may receive a command or data to be used by other component (e.g., the processor 1020) of the electronic device 1001, from the outside (e.g., a user) of the electronic device 1001. The input device 1050 may include, for example, a microphone, a mouse, or a keyboard.

The sound output device 1055 may output sound signals to the outside of the electronic device 1001. The sound output device 1055 may include, for example, a speaker or a receiver. The speaker may be used for general purposes, such as playing multimedia or recording, and the receiver may be used for receiving an incoming call. The receiver may be implemented as being separate from, or a part of, the speaker.

The display device 1060 may visually provide information to the outside (e.g., a user) of the electronic device 1001. The display device 1060 may include, for example, a display, a hologram device, or a projector and control circuitry to control a corresponding one of the display, hologram device, and projector. The display device 1060 may include touch circuitry adapted to detect a touch, or sensor circuitry (e.g., a pressure sensor) adapted to measure the intensity of force incurred by the touch.

The audio module 1070 may convert a sound into an electrical signal and vice versa. The audio module 1070 may obtain the sound via the input device 1050, or output the sound via the sound output device 1055 or a headphone of an external electronic device 1002 directly (e.g., wired) or wirelessly coupled with the electronic device 1001.

The sensor module 1076 may detect an operational state (e.g., power or temperature) of the electronic device 1001 or an environmental state (e.g., a state of a user) external to the electronic device 1001, and then generate an electrical signal or data value corresponding to the detected state. The sensor module 1076 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1077 may support one or more specified protocols to be used for the electronic device 1001 to be coupled with the external electronic device 1002 directly (e.g., wired) or wirelessly. The interface 1077 may include, for example, a high definition multimedia interface (HDMI), a universal serial bus (USB) interface, a secure digital (SD) card interface, or an audio interface.

A connecting terminal 1078 may include a connector via which the electronic device 1001 may be physically connected with the external electronic device 1002. The connecting terminal 1078 may include, for example, an HDMI connector, a USB connector, an SD card connector, or an audio connector (e.g., a headphone connector).

The haptic module 1079 may convert an electrical signal into a mechanical stimulus (e.g., a vibration or a movement) or an electrical stimulus which may be recognized by a user via tactile sensation or kinesthetic sensation. The haptic module 1079 may include, for example, a motor, a piezoelectric element, or an electrical stimulator.

The camera module 1080 may capture a still image or moving images. The camera module 1080 may include one or more lenses, image sensors, image signal processors, or flashes.

The power management module 1088 may manage power supplied to the electronic device 1001. The power management module 1088 may be implemented as at least part of, for example, a power management integrated circuit (PMIC).

The battery 1089 may supply power to at least one component of the electronic device 1001. The battery 1089 may include, for example, a primary cell which is not rechargeable, a secondary cell which is rechargeable, or a fuel cell.

The communication module 1090 may support establishing a direct (e.g., wired) communication channel or a wireless communication channel between the electronic device 1001 and the external electronic device (e.g., the electronic device 1002, the electronic device 1004, or the server 1008) and performing communication via the established communication channel. The communication module 1090 may include one or more communication processors that are operable independently from the processor 1020 (e.g., the AP) and supports a direct (e.g., wired) communication or a wireless communication. The communication module 1090 may include a wireless communication module 1092 (e.g., a cellular communication module, a short-range wireless communication module, or a global navigation satellite system (GNSS) communication module) or a wired communication module 1094 (e.g., a local area network (LAN) communication module or a power line communication (PLC) module). A corresponding one of these communication modules may communicate with the external electronic device via the first network 898 (e.g., a short-range communication network, such as Bluetooth™, wireless-fidelity (Wi-Fi) direct, or a standard of the Infrared Data Association (IrDA)) or the second network 1099 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 1092 may identify and authenticate the electronic device 1001 in a communication network, such as the first network 898 or the second network 1099, using subscriber information (e.g., international mobile subscriber identity (IMSI)) stored in the subscriber identification module 1096.

The antenna module 1097 may transmit or receive a signal or power to or from the outside (e.g., the external electronic device) of the electronic device 1001. The antenna module 1097 may include one or more antennas, and, therefrom, at least one antenna appropriate for a communication scheme used in the communication network, such as the first network 898 or the second network 1099, may be selected, for example, by the communication module 1090 (e.g., the wireless communication module 1092). The signal or the power may then be transmitted or received between the communication module 1090 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

Commands or data may be transmitted or received between the electronic device 1001 and the external electronic device 1004 via the server 1008 coupled with the second network 1099. Each of the electronic devices 1002 and 1004 may be a device of a same type as, or a different type, from the electronic device 1001. All or some of operations to be executed at the electronic device 1001 may be executed at one or more of the external electronic devices 1002, 1004, or 1008. For example, if the electronic device 1001 should perform a function or a service automatically, or in response to a request from a user or another device, the electronic device 1001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1001. The electronic device 1001 may provide the outcome, with or without further processing of the outcome, as at least part of a reply to the request. To that end, a cloud computing, distributed computing, or client-server computing technology may be used, for example.

One embodiment may be implemented as software (e.g., the program 1040) including one or more instructions that are stored in a storage medium (e.g., internal memory 1036 or external memory 1038) that is readable by a machine (e.g., the electronic device 1001). For example, a processor of the electronic device 1001 may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A phase-locked loop (PLL) for fractional-N frequency synthesis, the PLL comprising:
   a phase detector (PD) configured to receive a clock and a feedback clock (CLKFB), and to generate and output a resulting phase difference between the clock and the CLKFB;
   a low-pass loop filter configured to receive the resulting phase difference, and to generate and output a control voltage;
   a voltage-controlled oscillator (VCO) configured to receive the control voltage, and to generate and output a periodic signal based on the voltage;
   a sigma-delta modulator (SDM) configured to receive a frequency command word, and to generate and output a division sequence ratio and a selection control signal; and
   a multi-modulus divider (MMDIV) configured to receive differential inputs of the periodic signal from the VCO, and to receive the division sequence ratio and the selection control signal from the SDM, wherein the MMDIV is configured to generate a first CLKFB and a second CLKFB based on the differential inputs and the division sequence ratio, and to output one of the first CLKFB and the second CLKFB as the CLKFB to the PD based on the selection control signal.

2. The PLL of claim 1, wherein the clock is a reference clock (CLKREF).

3. The PLL of claim 1, wherein a rising edge of the second CLKFB is delayed by half a period of the VCO from a rising edge of the first CLKFB.

4. The PLL of claim 1, wherein the PD comprises:
   a phase frequency detector (PFD) configured to receive the clock and CLKFB, and to generate and output a signal proportional to the phase difference between the clock and the CLKFB; and
   a charge pump configured to receive the signal from the PFD, and to generate and output a sink and source current to the low-pass loop filter based on the received signal.

5. The PLL of claim 1, wherein the MMDIV comprises:
   a first flip-flop configured to receive a first differential input of the periodic signal and a clock signal, which is generated using the differential inputs and the division sequence ratio, and configured to generate and output the first CLKFB;
   a second flip-flop configured to receive a second differential input of the periodic signal and the clock signal, and configured to generate and output the second CLKFB; and
   a multiplexer configured to receive the first CLKFB, the second CLKFB, and the selection control signal, and output the one of the first CLKFB and the second CLKFB as the CLKFB based on the selection control signal.

6. The PLL of claim 1, wherein the SDM is configured to double the frequency command word, perform sigma-delta modulation on the doubled frequency command word to generate a first division sequence ratio, and halve the first division sequence ratio to output the division sequence ratio to the MMDIV.

7. The PLL of claim 6, wherein a carry out bit is added to the halved first division sequence ratio to generate the division sequence ratio.

8. The PLL of claim 1, wherein the SDM is further configured to generate a quantization error, and the PLL further comprises:
   a multiplier configured to receive the quantization error and a digital-to-time converter (DTC) gain, and to generate and output a DTC control word; and
   a DTC configured to receive a CLKREF and the DTC control word, and to generate and output a DTC clock (CLKDTC) as the clock input to the PD.

9. The PLL of claim 8, wherein the SDM is configured to double the frequency command word, perform sigma-delta modulation on the doubled frequency command word to generate a first quantization error, and halve the first quantization error to output the quantization error to the multiplier.

10. The PLL of claim 9, wherein VCO clock duty cycle error correction is performed on the quantization error before the multiplier.

11. A method for fractional-N frequency synthesis using phase-locked loop (PLL), the method comprising:
    detecting a phase difference between a clock and a feedback clock (CLKFB) by a phase detector (PD) of the PLL;
    determining a control voltage, by a low-pass loop filter of the PLL, based on the phase difference;
    generating a periodic signal, by a voltage-controlled oscillator (VCO) of the PLL, based on the control voltage;
    generating a division sequence ratio and a selection control signal, by a sigma-delta modulator (SDM) of the PLL, based on a frequency command word;
    generating, by a multi-modulus divider (MMDIV), a first CLKFB and a second CLKFB based on the division sequence ratio and differential inputs of the periodic signal; and
    outputting, from the MMDIV, one of the first CLKFB and the second CLKFB as the CLKFB to the PD based on the selection control signal.

12. The method of claim 11, wherein the clock is a reference clock (CLKREF).

13. The method of claim 11, wherein a rising edge of the second CLKFB is delayed by half a period of the VCO from a rising edge of the first CLKFB.

14. The method of claim 11, wherein detecting the phase difference comprises:
    generating, by a phase frequency detector (PFD), a signal proportional to the phase difference between the clock and the CLKFB; and
    providing, by a charge pump, a sink and source current to the low-pass loop filter based on the signal.

15. The method of claim 11, wherein generating the first CLKFB and the second CLKFB comprises:
    generating the first CLKFB, by a first flip-flop of the MMDIV, based on a first differential input of the periodic signal and a clock signal, which is generated using the differential inputs and the division sequence ratio; and generating the second CLKFB, by a second flip-flop of the MMDIV, based on a second differential input of the periodic signal and the clock signal.

16. The method of claim 11, wherein outputting one of the first CLKFB and the second CLKFB as the CLKFB comprises:
selecting, by a multiplexer of the MMDIV, the one of the first CLKFB and the second CLKFB as the CLKFB based on the selection control signal.

17. The method of claim 11, wherein generating the division sequence ratio comprises:
doubling the frequency command word;
performing sigma-delta modulation on the doubled frequency command word to generate a first division sequence ratio; and
halving the first division sequence ratio to output the division sequence ratio to the MMDIV.

18. The method of claim 17, further comprising adding a carry out bit to the halved first division sequence ratio to generate the division sequence ratio.

19. The method of claim 11, further comprising:
generating a quantization error, by the SDM,
combining the quantization error and a digital-to-time converter (DTC) gain to generate a DTC control word; and
generating, by a DTC, a DTC clock (CLKDTC) as the clock input to the PD, based on a CLKREF and the DTC control word.

20. The method of claim 19, wherein generating the quantization error comprises:
doubling the frequency command word;
performing sigma-delta modulation on the doubled frequency command word to generate a first quantization error; and
halving the first quantization error to output the quantization error.

21. The method of claim 20, further comprising performing VCO clock duty cycle error correction on the quantization error before combining with the DTC gain.

22. A multi-modulus divider (MMDIV) of a phase-locked loop (PLL) for fractional-N frequency synthesis, the multi-modulus divider comprising:
a divider configured to receive differential inputs of a periodic signal from a voltage-controlled oscillator (VCO) of the PLL, to receive a division sequence ratio from a sigma-delta modulator (SDM) of the PLL, and to generate and output a clock signal;
a first flip-flop configured to receive the clock signal and a first differential input of the periodic signal, and to generate and output a first feedback clock (CLKFB);
a second flip-flop configured to receive the clock signal and a second differential input of the periodic signal, and to generate and output a second CLKFB; and
a multiplexer configured to receive the first CLKFB, the second CLKFB, and a selection control signal from the SDM, and to output one of the first CLKFB and the second CLKFB as a CLKFB to a phase detector (PD) of the PLL, based on the selection control signal.

* * * * *